(12) United States Patent
Binyamini et al.

(10) Patent No.: US 9,299,458 B1
(45) Date of Patent: Mar. 29, 2016

(54) VOLTAGE COMPARATOR CIRCUIT AND USAGE THEREOF

(71) Applicant: International Business Machines Corporation, Armonk, NY (US)

(72) Inventors: Lior Binyamini, Haifa (IL); Lidar Herooti, Haifa (IL); Noam Jungmann, Ramat Hahayal (IL); Elazar Kachir, Haifa (IL); Donald W. Plass, Poughkeepsie, NY (US); Hezi Shalom, Haifa (IL); Israel Wagner, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/863,011

(22) Filed: Sep. 23, 2015

Related U.S. Application Data

(63) Continuation of application No. 14/476,886, filed on Sep. 4, 2014.

(51) Int. Cl.
*G11C 5/14* (2006.01)
*G11C 29/50* (2006.01)

(52) U.S. Cl.
CPC ...... *G11C 29/50* (2013.01); *G11C 5/14* (2013.01); *G11C 2029/5004* (2013.01)

(58) Field of Classification Search
CPC .... G11C 5/145; G11C 11/417; G11C 11/406; G11C 2211/4067; G11C 7/12; G11C 29/12005; G06F 1/26
USPC ............ 365/226, 229, 154, 201, 174, 189.07
See application file for complete search history.

(56) References Cited

U.S. PATENT DOCUMENTS

| 7,626,851 | B2 | 12/2009 | Behrends et al. |
| 7,915,877 | B2 * | 3/2011 | Meier ...................... G05F 1/575 323/267 |

(Continued)

FOREIGN PATENT DOCUMENTS

| CN | 102844817 A | 12/2012 |
| GB | 2497180 A | 6/2013 |
| KR | 101357076 B1 | 1/2014 |

OTHER PUBLICATIONS

Kim et al., "A 0.2 V, 480 kb Subthreshold SRAM With 1 k Cells Per Bitline for Ultra-Low-Voltage Computing," IEEE Journal of Solid-State Circuits, vol. 43, No. 2, Feb. 2008.

*Primary Examiner* — Fernando Hidalgo

(57) ABSTRACT

A method for testing a circuit comprising a memory element, a voltage comparator and a supply selector, the circuit is configured to be connected to two power supplies, the voltage comparator is configured to provide an output indicative of a voltage difference between the two power supplies above a predetermined threshold, the supply selector is configured to select a power supply to feed power to the memory element in response to the output from the voltage comparator. The method comprises connecting the two power supplies to the circuit, wherein said connecting comprises causing the two power supplies to drive power to the memory element and to another element of the circuit, wherein the voltage different between the two power supplies is above the predetermined threshold. The method further comprises that in response to said connecting, the supply selector of the circuit is invoked and disconnects one power supply from the memory element; whereby stress testing the circuit, the stress testing tests the memory element without a voltage difference condition, the stress testing tests the another element with the voltage difference condition.

2 Claims, 3 Drawing Sheets

(56) References Cited

U.S. PATENT DOCUMENTS

| | | |
|---|---|---|
| 8,654,594 B2 | 2/2014 | Arsovski et al. |
| 9,054,607 B2 * | 6/2015 | Otaguro ............... H02P 25/18 |
| 9,093,106 B2 * | 7/2015 | Otaguro ............... G11B 19/28 |
| 2013/0286717 A1 | 10/2013 | Adams et al. |
| 2014/0293680 A1 * | 10/2014 | Nii ............... G11C 8/08 |
| | | 365/154 |
| 2015/0098267 A1 * | 4/2015 | Jain ............... G11C 7/12 |
| | | 365/154 |

* cited by examiner

VOLTAGE COMPARATOR CIRCUIT AND USAGE THEREOF

CROSS REFERENCE TO RELATED APPLICATIONS

This application is a continuation of U.S. patent application Ser. No. 14/476,886, filed on Sep. 4, 2014, which is hereby incorporated by reference.

TECHNICAL FIELD

The present disclosure relates to electrical engineering in general, and to circuits that provide voltage comparison, in particular.

BACKGROUND

Hardware characterization is a very costly and time consuming effort which involves many resources, multiple test pattern generation and expensive tester time. Designs using several power supplies usually require special care during testing and hardware characterization. Reducing testing time on the one hand and simplifying test patterns on the other hand are key for chip testing.

During testing of a circuit design, stress testing may be performed. In some cases, the stress test includes performing voltage testing by connecting the circuit to two different power supplies. As a result, the circuit may be tested under different conditions, including different voltages. Different voltages may cause excessive current flows, Bias Temperature Instability (BTI) shifts, and even breaking of the circuit if too extreme.

BRIEF SUMMARY

One exemplary embodiment of the disclosed subject matter is a circuit comprising a first power supply having a first voltage and a second power supplying having a second voltage, wherein said first and second voltages are different at least in some cycles of said circuit, a memory element, wherein said first and second power supplies are driven into said memory element, a voltage comparator having connected thereto said first and second power supplies, wherein said voltage comparator is an analog to digital converter configured to provide digital output indicting of a voltage difference over a predetermined threshold between said first and second power supplies, and a supply selector element, wherein said supply selector element is configured to disconnect said second power supply from said memory element in response to the digital output of said voltage comparator.

Another exemplary embodiment of the disclosed subject matter is a method for testing a circuit comprising a memory element, a voltage comparator and a supply selector, the circuit is configured to be connected to two power supplies, the voltage comparator is configured to provide an output indicative of a voltage difference between the two power supplies above a predetermined threshold, the supply selector is configured to select a power supply to feed power to the memory element in response to the output from the voltage comparator. The method comprising: connecting the two power supplies to the circuit, wherein said connecting comprises causing the two power supplies to drive power to the memory element and to another element of the circuit, wherein the voltage different between the two power supplies is above the predetermined threshold, and in response to said connecting, the supply selector of the circuit is invoked and disconnects one power supply from the memory element, whereby stress testing the circuit, the stress testing tests the memory element without a voltage difference condition, the stress testing tests the another element with the voltage difference condition.

Yet another exemplary embodiment of the disclosed subject matter is a method for testing a circuit comprising a memory element, a voltage comparator and a supply selector, the circuit is configured to be connected to two power supplies, the voltage comparator is configured to provide an output indicative of a voltage different between the two power supplies above a predetermined threshold, the supply selector is configured to select a power supply to feed power to the memory element in response to the output from the voltage comparator. The method comprising: connecting the two power supplies to the circuit, wherein said connecting comprises causing the two power supplies to drive power to the memory element and to another element of the circuit, wherein the voltage difference between the two power supplies is below the predetermined threshold, modifying at least one of the two power supplies thereby changing the voltage difference to be above the predetermined threshold, in response to said modifying, the supply selector of the circuit is invoked and disconnects one power supply from the memory element, whereby stress testing the circuit, the stress testing tests the memory element with a voltage difference condition when the voltage difference is below the predetermined threshold and without the voltage difference condition when the voltage difference is above the predetermined threshold, the stress testing tests the another element with the voltage difference condition.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
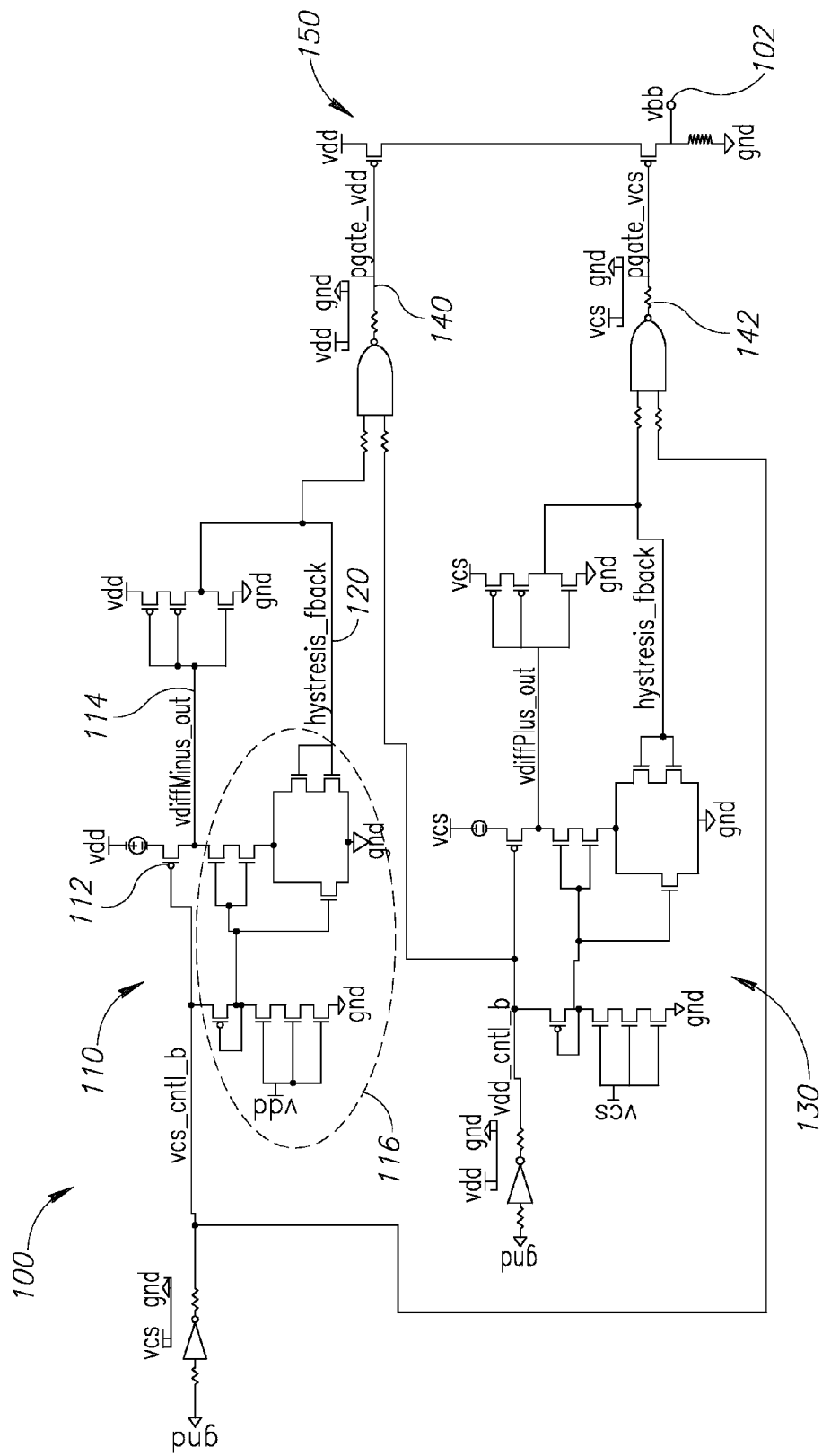
FIG. 1 shows a schematic diagram of a circuit, in accordance with some exemplary embodiments of the subject matter.

One technical problem dealt with by the disclosed subject matter is to provide for a way to detect and react to excessive voltage difference conditions in designs using more than one supply source. In response to excessive voltage difference, it may be desired to enable automatic change of a mode of operation of the circuit, such as automatic go in/out of stress mode.

Voltage difference sensitivity is one of the basic characterization requirements for Static Random Access Memory (SRAM) memory designs. Voltage difference is also a means to allow stressing SRAM cells to evaluate cell yield and stability.

Special designs with special test requirements may require special test patterns that differentiate them from other designs on the same chip. As a result, designs with special voltage difference considerations might require stand alone testing in order to test them, without disrupting the functionality of other designs in the same chip.

In view of the above, developing an efficient and reliable way to detect and act upon voltage difference scenarios in multiple power supply designs, and SRAM design specifically, is desired.

One technical solution is to provide a circuit with a voltage comparator. The voltage comparator may be constructed of basic devices. In the present disclosure, the term "basic devices" means a digital transistor, a resistor, a capacitor, and a logic gate. Basic devices do not include analog field-effect transistors (FETs), Double Gate (DG) FETs, diodes, or the like. The voltage comparator may be an Analog to Digital (A2D) converter that provides a digital output in response to detecting that a voltage difference between two power supplies is above a predetermined threshold.

In some exemplary embodiments, the circuit comprises a supply selector element configured to act upon the output of the voltage comparator, such as by switching from one mode of the circuit to a second mode. In some exemplary embodiments, the supply selector element may disconnect one of the power supplies from the memory element, thereby protecting the memory element from excessive DC current flow.

The disclosed subject matter provides a way to automatically detect pre-defined voltage difference conditions using a voltage comparator constructed only of logic devices. In some exemplary embodiments, n-channel field-effect transistor or p-channel field-effect transistor may be used to implement the voltage comparator. In some exemplary embodiments, the circuit may combine current mirror, hysteresis loop and pfet drop methods in order to provide improved sensitivity.

In some exemplary embodiments, the circuit does not require any special control circuits and relies only on a single switch (e.g. "test enable") and the design dedicated power supply to operate. Using the output of the voltage comparator, we can automatically control and limit the test scenarios for the design from a power/voltage difference perspective. More specifically, the disclosed subject matter may be used on an SRAM array for SRAM stress condition restriction during testing.

In some exemplary embodiments, the circuit may be useful for stress testing which may involve different voltages by different power sources. In some cases, different designs or components of a circuit may be stress tested under different voltage difference conditions, by protecting each design with a different voltage comparator. Additionally or alternatively, the circuit may also be useful to deal with power up/down sequences in which different portions of the circuit may be provided with different voltages.

Referring now to FIG. 1 showing a schematic diagram of a circuit, in accordance with some exemplary embodiments of the subject matter.

Circuit 100 comprises two different power supplies, denoted as Vcs and Vdd, which are also used to provide power to a memory element (not shown). The memory element may be a volatile memory such as an SRAM, a Dynamic Random Access Memory (DRAM), or the like. In some exemplary embodiments, the Vcs is a cell power supply that is driven to an array cell of memory element. In some cases, Vcs may intermittently be driven to one or more bit lines of the array cell that are used to write to and read from the cells. Circuit 100 exemplifies the bit line using a Wire 102, denoted Vbb, which is fed into the bit line. In some cases, the Vdd is a peripheral power supply that is driven intermittently to the bit line. In some cases, in a voltage testing mode Vdd is connected to the bit line and Vcs is connected to the array cell. In an operational mode, the Vcs is connected to both the bit line and to the array cell. In some exemplary embodiments, the bit line is connected directly or indirectly to Vcs, such as to provide a voltage of the Vcs with some modifications.

In some embodiments, a Supply Selector Element 150 is configured to disconnect the Vdd from the bit line. In some exemplary embodiments, Supply Selector Element 150 may comprise additional components that are configured to connect, directly or indirectly, the Vcs to the bit line instead of Vdd.

In some exemplary embodiments, Circuit 100 may comprise additional components (not shown), at least some of which may be intermittently or constantly driven by Vdd.

In some exemplary embodiments, Circuit 100 has a Voltage Comparator 110. PFET 112 is a p-channel field-effect transistor having a source driven by Vdd, a gate driven by Vcs and a drain connected to vdiffMinusOut 114. PFET 112 functions as a sensing device that is configured to translate a voltage difference between Vdd and Vcs to a digital output provided in vdiffMinusOut 114. A pre-defined difference (D), such as 10 mV, 50 mV, 100 mV, 200 mV, 300 mV, 500 mV, 1V, 1.5V, or the like, triggers Voltage Comparator 110. PFET 112 is loaded with high resistance impedance by Portion 116 which is comprised of n-channel field-effect transistors that are connected in serial and in parallel. When Vdd-Vcs<D, PFET 112 is shut off and vdiffMinusOut 114 is kept low. When Vdd-Vcs>D, PFET 112 is opened and vdiffMinusOut 114 charges up.

In some exemplary embodiments, the pre-defined difference is implemented in Circuit 100 by a number of transistors in Voltage Comparator 110. The specific implementation may depend on transistors' sizes, types, and inter-connection therebetween. In some exemplary embodiments, Portion 116 may be implemented by one or more capacitors.

In some exemplary embodiments, an Hysteresis Feedback Loop 120 may be configured to cause hysteresis which may improve the output stability. Once vdiffMinusOut 114 is charged, some pull-down devices in Portion 116 may be disconnected to increase impedance resistance thereby requiring a difference that is lower than the pre-defined difference in order to shut off PFET 112. As an example, in a circuit in which 200 mV is the pre-defined difference, a difference of 200 mV between Vcs and Vdd may be required in order to open PFET 112. However, due to Hysteresis Feedback Loop 120, once PFET 112 is opened, PFET may close only upon the difference dropping below about 180 mV.

Voltage Comparator 130 is a counterpart to Voltage Comparator 110, but dealing with the difference that is computed as Vcs-Vdd instead of Vdd-Vcs. Using Voltage Comparators 110 and 130, Circuit 100 may sense both the positive and negative difference between the power supplies. PgateVdd 140 and PgateVcs 142 may provide an indication that both Voltage Comparators 110, 130 indicate that while both Vdd and Vcs are operating, a voltage difference between them is below the pre-defined threshold. Put differently, voltage difference that is caused because only one power supply is operating is ignored and does not trigger an indication in PgateVdd 140 and PgateVcs 142, but rather such indication is provided if both power sources are operating and driving voltages that differ by more than a predetermined threshold.

In some exemplary embodiments, outputs of Voltage Comparators 110 and 130 may be fed to Supply Selector Element 150. In some exemplary embodiments, Supply Selector Element 150 may be implemented by Stacked PFETs, which, when both PgateVdd 140 and PgateVcs 142 are charged, is configured to drive Vdd into Vbb, thereby driving Vdd to the bit line and/or other components of Circuit 100 that are not shown. Additionally, other components may be configured to select a different power supply in case Vbb is kept low due to one of PgateVdd 140, PgateVcs 142 being closed.

In some exemplary embodiments, Supply Selector Element 150 may be configured to disconnect one of the power supplies in response to the output being charged up. In some exemplary embodiments, Supply Selector Element 150 may disconnect one power supply from the bit line of the memory element and connect instead the other power supply instead, thereby eliminating voltage difference in the memory element. In some exemplary embodiments, the voltage difference is eliminated in the memory element while remaining in another component of Circuit 100, such as may be desirable in case Circuit 100 is being stress tested and in case each component has a different voltage difference condition to be tested.

In some exemplary embodiments, a single voltage comparator may be implemented instead of the two voltage comparators illustrated in FIG. 1. It will be further noted that PFET 110 may be replaced by an n-channel field-effect transistor and generally both n-channel and p-channel field-effect transistors may be used.

Figure 2:
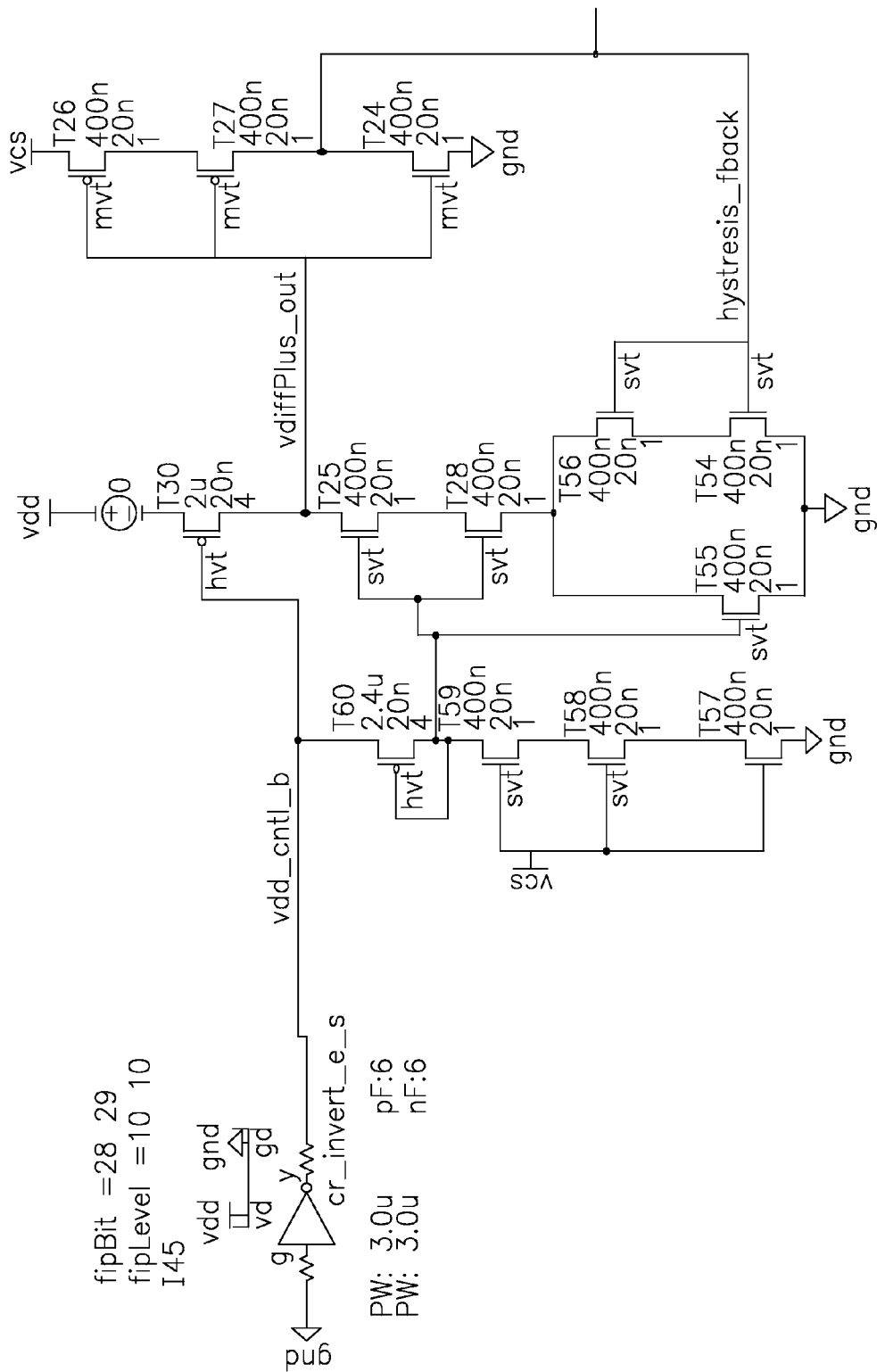
FIG. 2 shows a schematic diagram of a voltage comparator, in accordance with some exemplary embodiments of the subject matter.

Referring now to FIG. 2 showing a schematic diagram of a voltage comparator, in accordance with some exemplary embodiments of the subject matter. FIG. 2 exemplifies a voltage comparator in which the pre-defined voltage difference condition that trigger the p-channel field-effect transistor is 200 mV. The circuit is configured to match pre-defined voltage difference condition by the size and types of the transistors used in the circuit.

In some exemplary embodiments, a circuit in accordance with the disclosed subject matter may employ a threshold level that is dynamically determined by sensing current on a bit line (e.g., Wire 102). Additionally or alternatively, the circuit may include multiple configured options that are picked with a pre defined control decode scheme.

Figure 3:
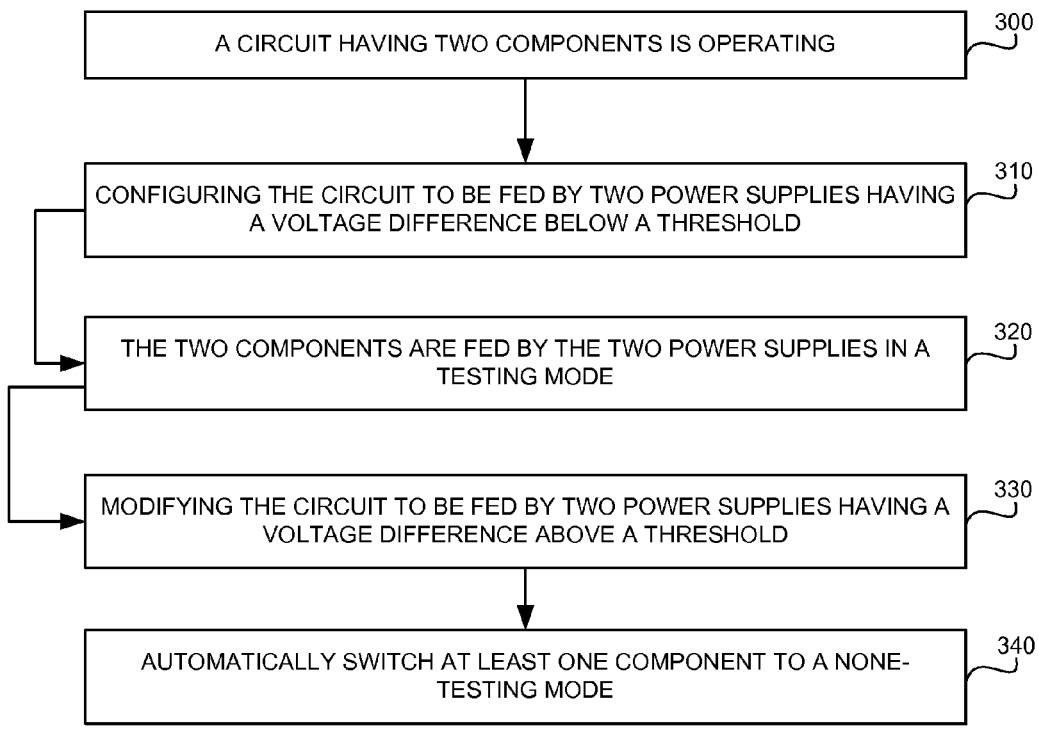
FIG. 3 shows a method, in accordance with some exemplary embodiments of the disclosed subject matter.

Referring now to FIG. 3 showing a method, in accordance with some exemplary embodiments of the subject matter. The method may be performed in order to stress test a circuit. The stress test may include voltage testing in which the operation of the circuit is tested after exposing the circuit or portions thereof to different voltage difference conditions.

A circuit that has at least two components is operating (300). The two components may be any of any type. During testing, the circuit is provided with power supply from two different power supplies (310). Each power supply is configured to drive voltage into each of the two components. As a result, both components may be affected by current flows. Initially, the voltage difference between the power supplies may be below a predetermined threshold and both power supplies drive voltage to the two components (320). In some exemplary embodiments, both components are stress tested and may be operating in testing mode. The predetermined threshold may be a threshold of one component for stress testing. As an example, a memory component may be stress tested up until 200 mV, while another component may be stress tested up until 500 mV.

One power supply may be modified or replaced so as to provide a different voltage to the circuit (330). After the modification, the voltage difference is above the predetermined threshold. The circuit may be configured to detect the voltage difference and automatically modify a mode of operation with respect to at least one component (340). In some exemplary embodiments, the mode of operation may be changed with respect to a memory element. The mode of operation may be changed from a voltage testing mode, in which the component is configured to be fed by the two power supplies, to an operation mode, in which the component is configured to be fed by one power supply. As a result, the voltage difference affecting the component is reduced and potentially eliminated, while preserving voltage difference for the other component for which stress testing continues.

In some exemplary embodiments, the disclosed subject matter may be utilized to stress test a single component in the circuit with two power supplies. The stress testing of the single component may be performed while other components of the circuit are fed by a single power supply. The single component may be tested until a voltage difference above a predetermined threshold is detected and in response to such detection, the single component may be switched to a nonetesting mode (or a none-voltage-testing mode) without interfering with the testing of other components of the circuit.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for testing a circuit comprising a memory element, a voltage comparator and a supply selector, the circuit is configured to be connected to two power supplies, the voltage comparator is configured to provide an output indicative of a voltage difference between the two power supplies above a predetermined threshold, the supply selector is configured to select a power supply to feed power to the memory element in response to the output from the voltage comparator, the method comprising:
   connecting the two power supplies to the circuit, wherein said connecting comprises causing the two power supplies to drive power to the memory element and to another element of the circuit, wherein the voltage different between the two power supplies is above the predetermined threshold; and
   in response to said connecting, the supply selector of the circuit is invoked and disconnects one power supply from the memory element;
   whereby stress testing the circuit, the stress testing tests the memory element without a voltage difference condition, the stress testing tests the another element with the voltage difference condition.

2. A method for testing a circuit comprising a memory element, a voltage comparator and a supply selector, the circuit is configured to be connected to two power supplies, the voltage comparator is configured to provide an output indicative of a voltage different between the two power supplies above a predetermined threshold, the supply selector is configured to select a power supply to feed power to the memory element in response to the output from the voltage comparator, the method comprising:
- connecting the two power supplies to the circuit, wherein said connecting comprises causing the two power supplies to drive power to the memory element and to another element of the circuit, wherein the voltage difference between the two power supplies is below the predetermined threshold;
- modifying at least one of the two power supplies thereby changing the voltage difference to be above the predetermined threshold
- in response to said modifying, the supply selector of the circuit is invoked and disconnects one power supply from the memory element;
- whereby stress testing the circuit, the stress testing tests the memory element with a voltage difference condition when the voltage difference is below the predetermined threshold and without the voltage difference condition when the voltage difference is above the predetermined threshold, the stress testing tests the another element with the voltage difference condition.

\* \* \* \* \*